United States Patent
Shim

(10) Patent No.: US 7,232,746 B2
(45) Date of Patent: Jun. 19, 2007

(54) METHOD FOR FORMING DUAL DAMASCENE INTERCONNECTION IN SEMICONDUCTOR DEVICE

(75) Inventor: Joon-Bum Shim, Seongnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,661

(22) Filed: Dec. 30, 2004

(65) Prior Publication Data

US 2005/0142831 A1    Jun. 30, 2005

(30) Foreign Application Priority Data

Dec. 31, 2003    (KR)    ............... 10-2003-0101810

(51) Int. Cl.
| | |
|---|---|
| H01L 23/48 | (2006.01) |
| H01L 23/52 | (2006.01) |
| H01L 23/40 | (2006.01) |
| H01L 21/44 | (2006.01) |
| H01L 21/4763 | (2006.01) |
| H01L 21/461 | (2006.01) |
| H01L 21/302 | (2006.01) |

(52) U.S. Cl. ............ 438/597; 438/637; 438/638; 438/618; 438/633; 438/636; 438/687; 438/710; 438/725; 438/706; 257/758; 257/E21.579; 257/E21.575; 257/E21.577; 257/E21.585; 257/E21.218

(58) Field of Classification Search ............... 438/618, 438/633, 636–638, 597, 687, 706, 710, 725; 257/758
See application file for complete search history.

(56) References Cited

U.S. PATENT DOCUMENTS

| | | | |
|---|---|---|---|
| 6,323,121 B1 | 11/2001 | Liu et al. | |
| 2002/0182880 A1* | 12/2002 | Zhu et al. | .................. 438/724 |
| 2004/0219783 A1* | 11/2004 | Ahn et al. | .................. 438/638 |
| 2005/0059233 A1* | 3/2005 | Wang et al. | ................ 438/633 |
| 2005/0106866 A1* | 5/2005 | Omura et al. | ............... 438/687 |

* cited by examiner

*Primary Examiner*—Michael Lebentritt
*Assistant Examiner*—Mohsen Ahmadi
(74) *Attorney, Agent, or Firm*—Lowe Hauptman & Berner, LLP

(57) ABSTRACT

A method for forming a dual damascene interconnection in a semiconductor device, which is capable of preventing a lower metal film from being corroded. The method includes the steps of forming an etch stop film and an intermetal insulating film sequentially on a lower metal film to be interconnected, forming a via hole for exposing a portion of a surface of the etch stop film through the intermetal insulating film, and forming a trench having a width wider than that of the via hole on the intermetal insulating film. The method also includes the steps of exposing the lower metal film by removing the etch stop film by performing an etching process using an etching equipment of a dual plasma source, performing a nitrogen passivation process for the exposed lower metal film, and forming a barrier metal film and an upper metal film sequentially within the trench and the via hole.

12 Claims, 3 Drawing Sheets

METHOD FOR FORMING DUAL DAMASCENE INTERCONNECTION IN SEMICONDUCTOR DEVICE

BACKGROUND OF THE INVENTION (a) Field of the Invention

The present invention relates to a method for forming an interconnection in a semiconductor device, and more particularly to a method for forming a dual damascene interconnection in a semiconductor device.

(b) Description of the Related Art

Recently, as a copper interconnection having an electrical characteristic superior to aluminum (Al) or tungsten (W) has been introduced, a dual damascene process for overcoming a difficulty in dry etching copper is being widely used. In the dual damascene process, a via hole and a trench are first formed, the via hole and the trench are filled with a copper film, and then, a planarization process is performed.

More specifically, an etch stop film and an intermetal insulating film are sequentially formed on a lower metal film, and a via hole is formed using a mask pattern for via hole formation. Next, a trench for exposing the via hole completely is formed using a mask pattern for trench formation. Namely, the via hole is formed under the intermetal insulating film and the trench is formed above the intermetal insulating film.

Subsequently, after exposing the lower metal film by removing the etch stop film exposed through the via hole, a barrier metal film and an upper metal film are sequentially formed.

In the related art method for forming a dual damascene interconnection, a copper (Cu) film is used as the lower metal film, and a nitride film is used as the etch stop film. The removal of the etch stop film formed with the nitride film is performed by a dry etching process.

Accordingly, if the lower metal film is damaged while the etch stop film is removed, there is a problem in that the lower metal film is apt to be corroded when it is exposed to water in the air before and after performing a subsequent process. If the lower metal film is corroded, electrical characteristics and reliability of devices are deteriorated.

SUMMARY OF THE INVENTION

In considerations of the above problem, the present invention advantageously provides a method for forming a dual damascene interconnection in a semiconductor device, which is capable of preventing a lower metal film from being corroded.

To achieve the object, according to an aspect of the present invention, there is provided a method for forming a dual damascene interconnection in a semiconductor device, including the steps of forming an etch stop film and an intermetal insulating film sequentially on a lower metal film to be interconnected, forming a via hole for exposing a portion of a surface of the etch stop film through the intermetal insulating film, and forming a trench having a width wider than that of the via hole on the intermetal insulating film. The method also includes the steps of exposing the lower metal film by removing the etch stop film by performing an etching process using an etching equipment of a dual plasma source, performing a nitrogen passivation process for the exposed lower metal film, and forming a barrier metal film and an upper metal film sequentially within the trench and the via hole.

Preferably, the etching process for removing the etch stop film is performed in an etching equipment of a dual plasma source under conditions of a source power of about 100 W to 300 W, a bias power of about 500 W to about 1000 W, a pressure of about 20 mTorr to about 100 mTorr, and a volume of about 20 liters to about 45 liters. In this case, preferably, the etching process for removing the etch stop film is performed using a $CF_4$ gas of about 10 sccm to about 50 sccm and an Ar gas of about 100 sccm to about 400 sccm.

Preferably, the nitrogen passivation process is performed in-situ with the etching process for removing the etch stop film using the etching equipment of the dual plasma source. Preferably, in this case, the nitrogen passivation process is performed using a nitrogen gas of about 200 sccm to about 400 sccm for about 40 seconds to about one minute while a bias power of the etching equipment of the dual plasma source remains at about 500 W to about 1000 W and a pressure remains at about 100 mTorr to about 200 mTorr.

Preferably, the lower metal film is made with a copper film, and the etch stop film is made with a nitride film.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

A preferred embodiment of the present invention will now be described in detail with reference to the accompanying drawings. The following embodiments may be modified in various forms, but should not be interpreted to be limited thereto.

FIGS. 1 to 5 are sectional views illustrating a method for forming a dual damascene interconnection according to the present invention.

Figure 1:
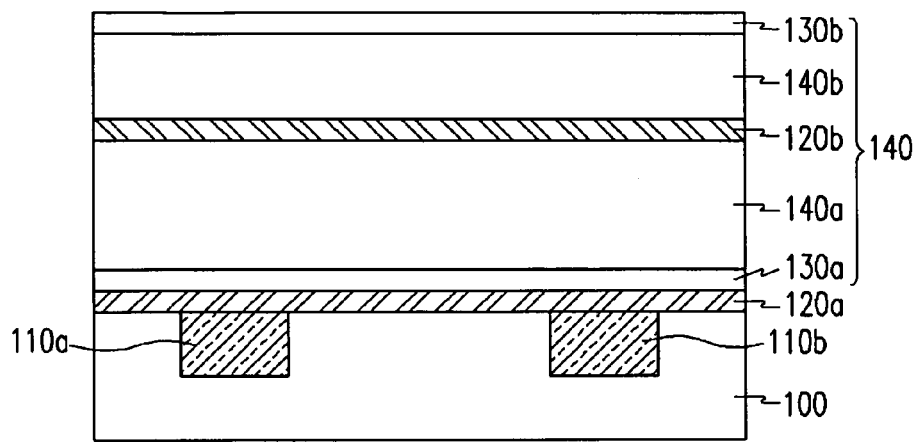
FIGS. 1 to 5 are sectional views illustrating a method for forming a dual damascene interconnection in a semiconductor device according to the present invention.

Referring to FIG. 1, first, a first etch stop film 120a, a first capping film 130a, a first low dielectric insulating film 140a, a second etch stop film 120b, a second low dielectric insulating film 140b, and a second capping film 130b are sequentially formed on an insulating film 100 and lower metal films 110a and 110b disposed within the insulating film 100.

Although not shown in the figure, the lower metal films 110a and 110b formed with a copper (Cu) film may be connected to other lower metal films or may be directly connected to an impurity region of a semiconductor substrate.

The first and second etch stop films 120a and 120b are formed with a silicon nitride film having a thickness of about 500 Å to about 900 Å. The first and second capping films 130a and 130b are formed with a P—$SiH_4$ film. The first and second low dielectric insulating films 140a and 140b are formed with a fluoro-silicate glass (FSG) film having a thickness of about 7000 Å to about 10000 Å. The first capping film 130a, the first low dielectric insulating film 140a, the second etch stop film 120b, the second low dielectric insulating film 140b, and the second capping film 130b form an intermetal insulating (IMD) film 140.

Figure 2:
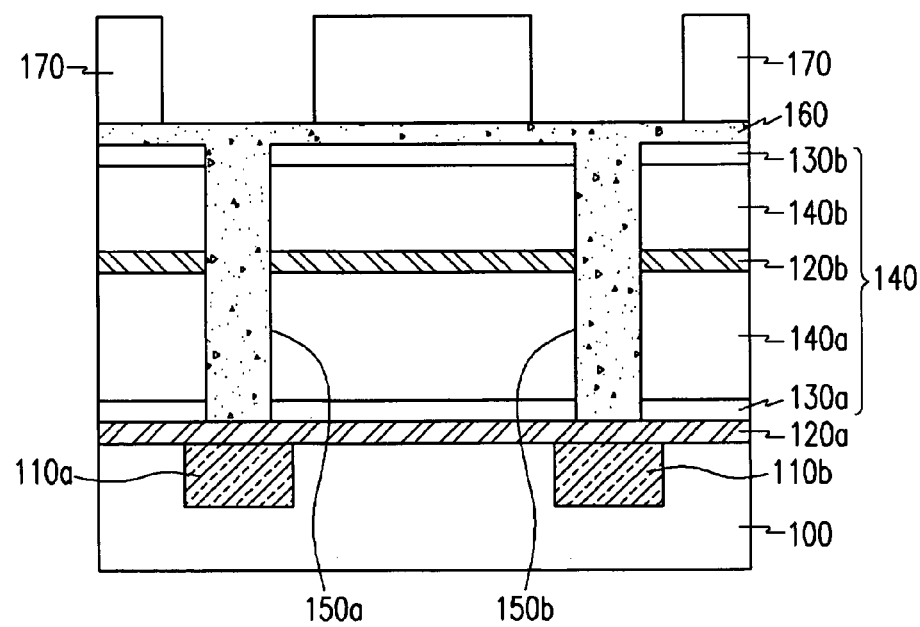

Referring to FIG. 2, a mask pattern (not shown) for via hole formation is formed with a photoresist film pattern on the second capping film 130b. Next, via holes 150a and 150b for exposing a portion of a surface of the first etch stop film 120a through the intermetal insulating film are formed by performing an etching process using this mask pattern as an etch mask. Next, a bottom antireflective coating film 160 is formed on an entire surface such that the via holes 150a and 150b are filled with the film 160. This bottom antireflective coating film 160 is also formed on the second capping film 130b.

Subsequently, a mask pattern 170 for trench formation is formed on the bottom antireflective coating film 160. The mask pattern 170 for trench formation is formed with a photoresist film pattern.

Figure 3:
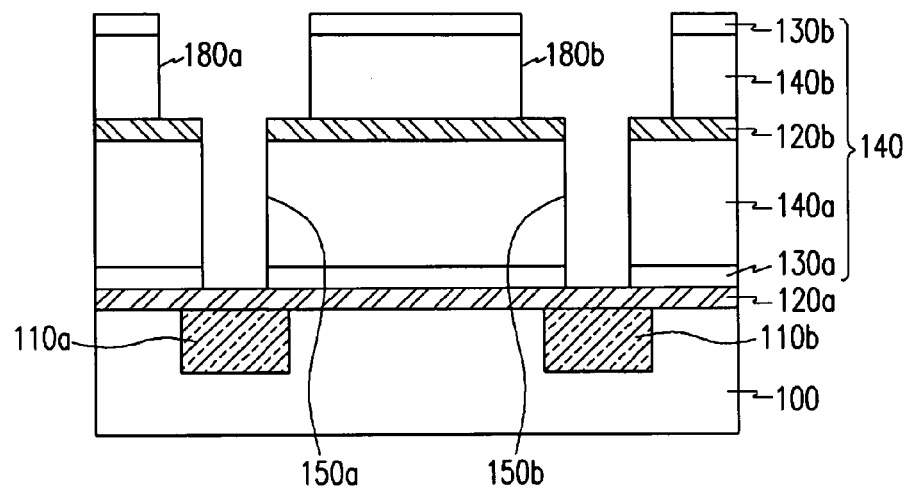

Referring to FIG. 3, next, trenches 180a and 180b are formed by removing the bottom antireflective coating film 160, the second capping film 130b and the second low dielectric insulating film 140b by performing an etching process using the mask pattern (170 in FIG. 2) for trench formation as an etch mask. The second etch stop 120b is used as an etch stop film in the etching process.

After forming the trenches 180a and 180b, the mask pattern (170 in FIG. 2) for trench formation is removed. Next, the portion of the surface of the first etch stop film 120a is exposed by completely removing the bottom anti-reflective coating film 160 remaining within the via holes 150a and 150b and on the second capping film 130b.

Figure 4:
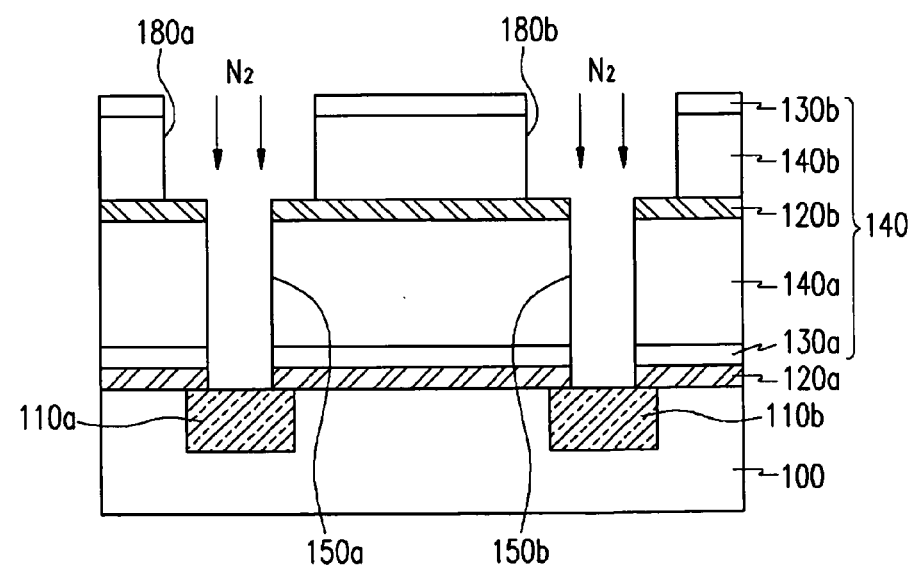

Subsequently, as shown in FIG. 4, the first etch stop film 120a is removed using an etching equipment of a dual plasma source. When the first etch stop film 120a is removed, portions of surfaces of the lower metal films 110a and 110b are exposed.

The etching process for removing the first etch stop film 120a is performed in the etching equipment of the dual plasma source, as described above. At this time, the etching process is performed under conditions where a source power of the etch equipment is about 100 to 300 W, a bias power thereof is about 500 to 1000 W, a pressure is about 20 to 100 mTorr, and a volume is about 20 to 45 liter. In this case, used gases are a $CF_4$ gas of about 10 to 50 sccm and an Ar gas of 100 to 400 sccm.

Subsequently, a nitrogen ($N_2$) passivation process is performed for the exposed lower metal films 110a and 110b. The nitrogen ($N_2$) passivation process is performed in-situ in the etching equipment of the plasma source after removing the first etch stop film 120a. In this case, the nitrogen ($N_2$) passivation process is performed using a nitrogen ($N_2$) gas of about 200 to 400 sccm for about 40 seconds to one minute while a bias power of the etching equipment of the dual plasma source remains at about 500 to 1000 W and a pressure remains at about 100 to 200 mTorr.

Figure 5:
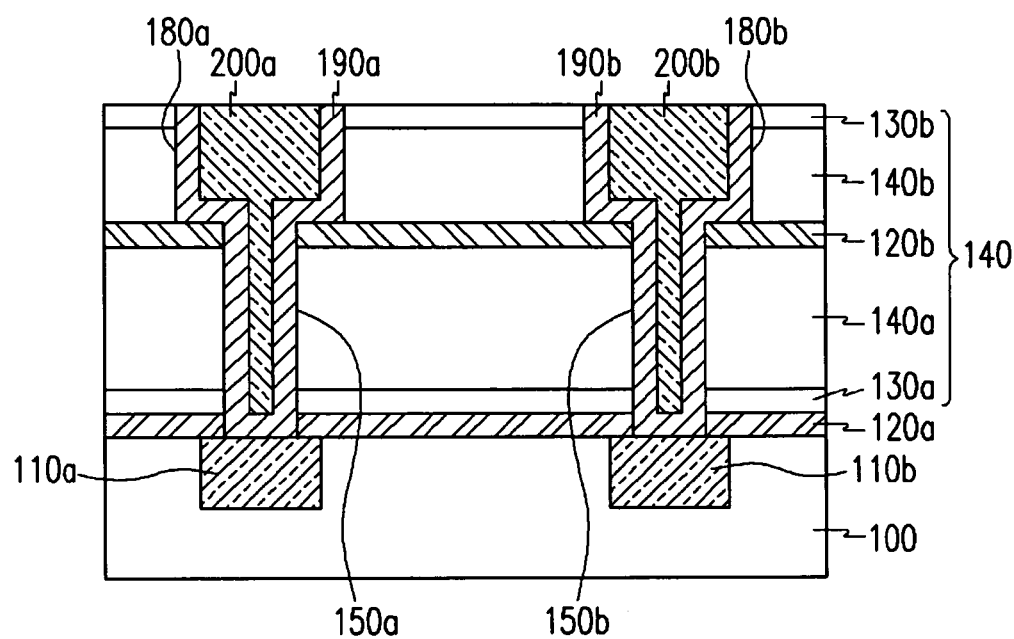

Referring to FIG. 5, next, barrier metal layers 190a and 190b are formed with a Ti/TiN film on inner walls of the via holes 150a and 150b and the trenches 180a and 180b, and upper metal films 200a and 200b are formed with a copper (Cu) film on the barrier metal layers 190a and 190b such that the via holes 150a and 150b and the trenches 180a and 180b are filled with the upper metal films 200a and 200b. Next, a dual damascene interconnection is completed by performing a typical chemical mechanical polishing process.

As apparent from the above description, with the method for forming a dual damascene interconnection according to the present invention, by performing the nitrogen passivation process after dry etching the etch stop film on the lower nitride film, interconnections can be stably formed in a subsequent process after forming the dual damascene interconnection. Accordingly, electrical characteristics and reliability of semiconductor devices can be improved.

This application incorporates by reference in its entirety an application for METHOD FOR FABRICATING THE DUAL DAMASCENE INTERCONNECTION IN SEMICONDUCTOR DEVICE filed in the Korean Industrial Property Office on Dec. 31, 2003 and there duly assigned Seral No. 10-2003-0101810.

Although the preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for forming a dual damascene interconnection in a semiconductor device, comprising the steps of:
    forming an etch stop film and an intermetal insulating film sequentially on a lower metal film to be interconnected;
    forming a via hole for exposing a portion of a surface of the etch stop film through the intermetal insulating film;
    forming a trench having a width wider than a width of the via hole on the intermetal insulating film;
    exposing the lower metal film by removing the etch stop film by performing an etching process using an etching equipment of a dual plasma source;
    performing a nitrogen passivation process for the exposed lower metal film while a bias power of the etching equipment of the dual plasma source remains; and
    forming a barrier metal film and an upper metal film sequentially within the trench and the via hole.

2. The method of claim 1, wherein the etching process for removing the etch stop film is performed in an etching equipment of a dual plasma source under conditions of a source power of about 100 W to about 300 W, a bias power of about 500 W to about 1000 W, a pressure of about 20 mTorr to about 100 mTorr, and a volume of about 20 liters to about 45 liters.

3. The method of claim 2, wherein the etching process for removing the etch stop film is performed using a $CF_4$ gas of about 10 sccm to about 50 sccm and an Ar gas of about 100 sccm to about 400 sccm.

4. The method of claim 1, wherein the step of performing a nitrogen passivation process is performed in-situ with the etching process for removing the etch stop film using the etching equipment of the dual plasma source.

5. The method of claim 4, wherein the step of performing a nitrogen passivation process is performed using a nitrogen gas of about 200 sccm to about 400 sccm for about 40 seconds to about one minute while a bias power of the etching equipment of the dual plasma source remains at about 500 W to about 1000 W and a pressure remains at about 100 mTorr to about 200 mTorr.

6. The method of claim 1, wherein the lower metal film is made with a copper film, and the etch stop film is made with a nitride film.

7. A method for forming a dual damascene interconnection in a semiconductor device, comprising:
    a step for forming an etch stop film and an intermetal insulating film sequentially on a lower metal film to be interconnected;
    a step for forming a via hole for exposing a portion of a surface of the etch stop film through the intermetal insulating film;
    a step for forming a trench having a width wider than a width of the via hole on the intermetal insulating film;

a step for exposing the lower metal film by removing the etch stop film by performing an etching process using an etching equipment of a dual plasma source;

a step for performing a nitrogen passivation process for the exposed lower metal film while a bias power of the etching equipment of the dual plasma source remains; and a step for forming a barrier metal film and an upper metal film sequentially within the trench and the via hole.

8. The method of claim 7, wherein the etching process for removing the etch stop film is performed in an etching equipment of a dual plasma source under conditions of a source power of about 100 W to about 300 W, a bias power of about 500 W to about 1000 W, a pressure of about 20 mTorr to about 100 mTorr, and a volume of about 20 liters to about 45 liters.

9. The method of claim 7, wherein the etching process for removing the etch stop film is performed using a $CF_4$ gas of about 10 sccm to about 50 sccm and an Ar gas of about 100 sccm to about 400 sccm.

10. The method of claim 7, wherein the step for performing a nitrogen passivation process is performed in-situ with the etching process for removing the etch stop film using the etching equipment of the dual plasma source.

11. The method of claim 10, wherein the step for performing a nitrogen passivation process is performed using a nitrogen gas of about 200 sccm to about 400 sccm for about 40 seconds to about one minute while a bias power of the etching equipment of the dual plasma source remains at about 500 W to about 1000 W and a pressure remains at about 100 mTorr to about 200 mTorr.

12. The method of claim 7, wherein the lower metal film is made with a copper film, and the etch stop film is made with a nitride film.

* * * * *